US012684776B2

(12) United States Patent
Chiu et al.

(10) Patent No.: US 12,684,776 B2
(45) Date of Patent: Jul. 14, 2026

(54) MEMORY DEVICE

(71) Applicant: MACRONIX International Co., Ltd., Hsinchu (TW)

(72) Inventors: Yuan-Chieh Chiu, Hsinchu County (TW); Kuan-Ting Lu, Taichung (TW); Chiung-Kun Huang, New Taipei (TW)

(73) Assignee: MACRONIX International Co., Ltd., Hsinchu (TW)

( * ) Notice: Subject to any disclaimer, the term of this patent is extended or adjusted under 35 U.S.C. 154(b) by 431 days.

(21) Appl. No.: 18/472,230

(22) Filed: Sep. 22, 2023

(65) Prior Publication Data

US 2025/0107081 A1     Mar. 27, 2025

(51) Int. Cl.
H10B 43/27 (2023.01)

(52) U.S. Cl.
CPC .................................... H10B 43/27 (2023.02)

(58) Field of Classification Search
CPC ................................ H10B 43/27; H10B 43/50
See application file for complete search history.

(56) References Cited

U.S. PATENT DOCUMENTS

2021/0036010 A1* 2/2021 Sim .......................... H10B 43/10
2022/0367511 A1* 11/2022 Hwang ................... H10B 43/27

2023/0163181 A1  5/2023  Fulford et al.
2023/0187359 A1  6/2023  Wang et al.
2024/0371760 A1* 11/2024  Mayuzumi ............. H10B 43/40
2024/0371763 A1* 11/2024  Arai ....................... H10B 41/10

FOREIGN PATENT DOCUMENTS

TW        202315085        4/2023
TW        202318645        5/2023

OTHER PUBLICATIONS

"Office Action of Taiwan Counterpart Application", issued on Jul. 18, 2024, pp. 1-4.

* cited by examiner

*Primary Examiner* — Matthew L Reames
(74) *Attorney, Agent, or Firm* — J.C. PATENTS

(57)        ABSTRACT

A memory device includes: an interconnect structure, a staircase structure, a dielectric layer and a stop structure. The interconnect structure is located above a substrate. The staircase structure is located above the interconnect structure. The dielectric layer is located above the interconnect structure and covers the staircase structure. The stop structure is located between the interconnect structure and the staircase structure, and between the interconnect structure and the dielectric layer, and the stop structure has an opening exposing the interconnect structure. The first contact extends through the dielectric layer and the opening, and is connected to the interconnect of the interconnect structure. The middle width of the opening is not equal to the top width of the opening, or the middle width of the opening is not equal to the bottom width of the opening. The memory device may be 3D NAND flash memory with high capacity and high performance.

19 Claims, 8 Drawing Sheets

MEMORY DEVICE

TECHNICAL FIELD

The embodiment of the disclosure relates to an integrated circuit, and particularly, to a memory device.

DESCRIPTION OF RELATED ART

Since a non-volatile memory device (e.g., a flash memory) has the advantage that stored data does not disappear at power-off, it becomes a widely used memory device for a personal computer or other electronics equipment.

Currently, the flash memory array commonly used in the industry includes a NOR flash memory, a NAND flash memory and ROM memory applications. Since the NAND flash memory has a structure in which memory cells are connected together in series, degree of integration and area utilization thereof are better than those of the NOR flash memory. Thus, the NAND flash memory has been widely used in a variety of electronic products. Besides, in order to further enhance the degree of integration of the memory device, a three-dimensional NAND flash memory is developed. However, there are still some challenges associated with the three-dimensional NAND flash memory. For example, the through array contact is often inclined or shifted, even causing a short with other components.

SUMMARY

The disclosure provides a memory device that may reduce or prevent a contact from being shifted or inclined and causing a short with other components.

The embodiment of the disclosure provides a memory device. The memory device includes a substrate, an interconnect structure, a staircase structure, a dielectric layer and a stop structure. The interconnect structure is located above a substrate. The staircase structure is located above the interconnect structure. The dielectric layer is located above the interconnect structure and covers the staircase structure. The stop structure is located between the interconnect structure and the staircase structure and between the interconnect structure and the dielectric layer, and the stop structure has an opening exposing the interconnect structure. The first contact extends through the dielectric layer and the opening, and is connected to the interconnect of the interconnect structure. The middle width of the opening is not equal to the top width of the opening, or the middle width of the opening is not equal to the bottom width of the opening.

The embodiment of the disclosure provides a memory device. The memory device includes a substrate, an interconnect structure, a staircase structure, a dielectric layer, a stop structure, a first contact, a second contact and liner layers. The interconnect structure is located above a substrate. The staircase structure is located above the interconnect structure. The dielectric layer is located above the interconnect structure and covers the staircase structure. The stop structure is located between the interconnect structure and the staircase structure and between the interconnect structure and the dielectric layer, and the stop structure has an opening exposing the interconnect structure. The first contact and the second contact extend through the dielectric layer and the opening, and are connected to an interconnect of the interconnect structure. The liner layers are located on a sidewall of the opening.

The embodiment of the disclosure provides a memory device. The memory device includes a substrate, an interconnect structure, a staircase structure, a dielectric layer, a stop structure, a first contact and a second contact. The interconnect structure is located above a substrate. The staircase structure is located above the interconnect structure. The dielectric layer is located above the interconnect structure and covers the staircase structure. The stop structure is located between the interconnect structure and the staircase structure and between the interconnect structure and the dielectric layer, and the stop structure has an opening exposing the interconnect structure. The first contact and the second contact extend through the dielectric layer and the opening, and are connected to an interconnect of the interconnect structure. A base angle of the opening ranges from 84° to 86° or is larger than 90°.

Based on the above, in the embodiment of the disclosure, the opening of the stop structure is designed to have various profiles and angles, or a liner layer is formed on the sidewall of the opening. Thus, even if the contact is shifted or inclined, the occurrence of a short may be reduced or prevented. Accordingly, the yield of the memory device may be improved.

DESCRIPTION OF THE EMBODIMENTS

Figure 1:
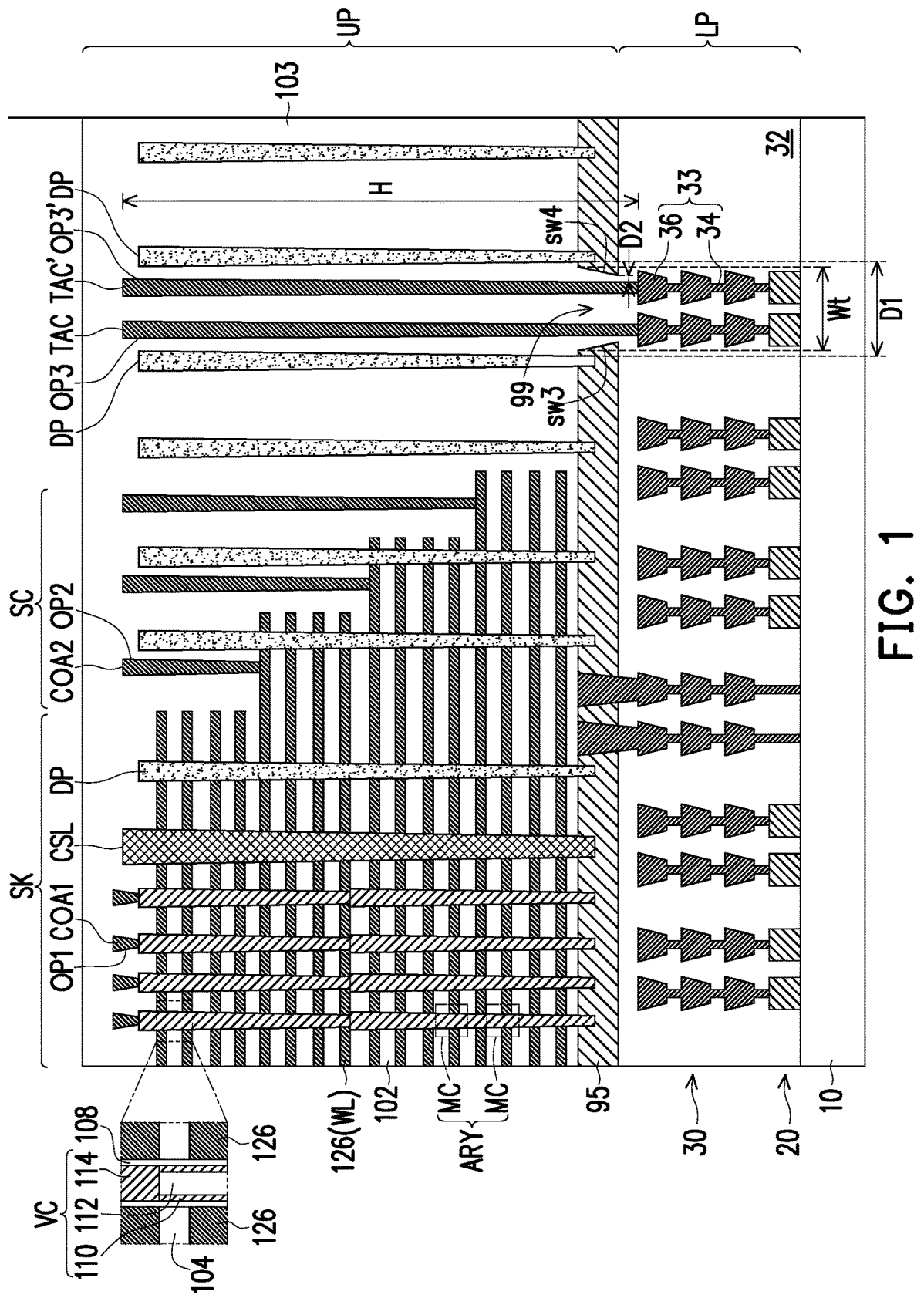
FIG. 1 is a schematic cross-sectional view of a semiconductor device with a CMOS-Under-Array (CUA) structure according to an embodiment of the disclosure.

FIG. 1 is a schematic cross-sectional view of a semiconductor device with a CMOS-Under-Array (CUA) structure according to an embodiment of the disclosure.

Referring to FIG. 1, a semiconductor device of the embodiment of the disclosure is a complementary metal oxide semiconductor device under a memory array (CMOS-Under-Array (CUA)) structure. The CUA structure includes a substrate 10, a lower level LP and an upper level UP. The lower level LP is formed above the substrate 10, and the upper level UP is formed above the lower level LP.

The substrate 10 may be a semiconductor substrate, such as a silicon-containing substrate. The lower level LP may include a device layer 20 and an interconnect structure 30. The device layer 20 may include an active device or a passive device. The active device is a transistor, a diode and so on. The passive device is a capacitor, an inductor and so on. The transistor may be an N-type metal-oxide-semiconductor (NMOS) transistor, a P-type metal-oxide-semiconductor (PMOS) transistor, or a complementary metal-oxide-semiconductor (CMOS). The device layer 20 may include a plurality of peripheral circuits, a plurality of row decoders and column decoders, and a plurality of page buffers (not shown).

The interconnect structure 30 may include a plurality of dielectric layers 32 and an interconnect 33 formed in the dielectric layers 32. The interconnect 33 includes a plurality of plugs 34, a plurality of conductive lines 36 and so on. The dielectric layer 32 separates adjacent conductive lines 36. The conductive lines 36 may be connected to each other through the plug 34, and the conductive lines 36 may be connected to the device layer 20 through the plugs 34. The number of layers of conductive lines 36 and plugs 34 shown in FIG. 1 is only for illustration, and the present disclosure is not limited thereto, and may include more or fewer layers. For example, the conductive lines 36 shown in FIG. 1 have three layers. In other embodiments, the conductive lines 36 may have seven layers.

The upper level UP includes a stack structure SK, a staircase structure SC and a stop structure 95. The stack structure SK includes a plurality of conductive layers 126 and a plurality of insulating layers 102 stacked alternately. The material of the conductive layer 126 includes tungsten (W), molybdenum (Mo), ruthenium (Ru), aluminum (Al), titanium (Ti), titanium nitride (TiN), or a combination thereof. The material of the insulating layer 102 includes silicon oxide. The staircase structure SC includes a plurality of conductive layers 126 and a plurality of insulating layers 102 stacked alternately. The staircase structure SC is formed by performing a multi-stage patterning process on the stack structure SK, but the disclosure is not limited thereto. The patterning process may include processes such as lithography, etching, and trimming processes.

A plurality of vertical channel pillars VC extend through the stack structure SK. The vertical channel pillar VC may include a channel layer 110, an insulating pillar 112 and a conductive plug 114. The charge storage structure 108 may be an oxide/nitride/oxide (ONO) composite layer. The conductive layers 126 of the stack structure SK serve as a plurality of word lines WL. The charge storage structure 108 is disposed between the word line WL and the vertical channel pillar VC, and the intersection between them is a memory cell MC. Therefore, a memory array ARY composed of a plurality of memory cells MC is formed in the stack structure SK.

The dielectric layer 103 covers the staircase structure SC and the stack structure SK. The dielectric layer 103 may be a multilayer. The material of the dielectric layer 103 is, for example, silicon oxide, silicon nitride or a combination thereof. The dielectric layer 103 is formed by, for example, forming a dielectric material layer to cover the staircase structure SC. Then, a planarization process, such as a chemical mechanical polishing process, is performed to remove excess dielectric material layer.

The stop structure 95 is disposed between the stack structure SK and the interconnect structure 30, between the staircase structure SC and the interconnect structure 30, and between the dielectric layer 103 and the interconnect structure 30. The stop structure 95 may be a single semiconductor layer or multiple semiconductor layers (not shown). The stop structure 95 may serve as a source line 95, and may also be referred to as a common source conductive layer 95. The stop structure 95 has an opening 99 exposing the dielectric layer 32 of the interconnect structure 30.

A source line slit CSL extends through the stack structure SK and is connected to the source line 95. The source line slit CSL may be used to conduct current from the source line 95.

A plurality of support pillars DP extend through the dielectric layer 103 and the staircase structure SC, and land on the stop structure 95. The support pillars DP may prevent the staircase structure SC from collapsing during the gate replacement process. The support pillar DP may be formed simultaneously with the vertical channel pillar VC, so that the support pillar DP may have a similar structure to the vertical channel pillar VC. However, the disclosure is not limited thereto. In other embodiments, the support pillar DP may be formed separately, and the structure thereof may be different from the combined structure of the charge storage structure 108 and the vertical channel pillar CP. For example, the support pillar DP is made of an insulating material.

A plurality of contacts COA1, COA2 and TAC, TAC' extend through the dielectric layer 103 and are electrically connected to the conductive plug 114 of the vertical channel pillar VC, the conductive layer 126 of the staircase structure SC, and the conductive line 36 of the interconnect structure 30 respectively. The contact TAC and TAC' may also be referred to as a through array contact. The contact COA1, COA2 and TAC, TAC' may include a barrier layer and a conductive layer. The material of the barrier layer is titanium (Ti), titanium nitride (TiN), tantalum (Ta), tantalum nitride (TaN), cobalt (Co) or a combination thereof, and the material of the conductive layer is tungsten (W), ruthenium (Ru) or a combination thereof. The formation method of the contacts COA1, COA2 and TAC, TAC' is, for example, first forming a plurality of contact openings OP1, OP2, OP3, OP3' by lithography and etching processes, sequentially forming a barrier layer and a conductive layer in the contact openings OP1, OP2, OP3, OP3, and then performing a planarization process such as a chemical-mechanical polishing process.

Since the contacts TAC and TAC' are used to electrically connect to the conductive lines 36 of the interconnect structure 30, the contacts TAC and TAC' may have a relatively large height H. During the etching process of forming the contact openings OP3 and OP3', a shift of the contact openings OP3 and OP3' often occurs, so that the formed contacts TAC and TAC' are inclined or shifted.

FIG. 2A to FIG. 2G show schematic diagrams of various adjacent contacts TAC and TAC'. The inclined degree of the contacts TAC and TAC' may be the same or different.

Figure 2C:
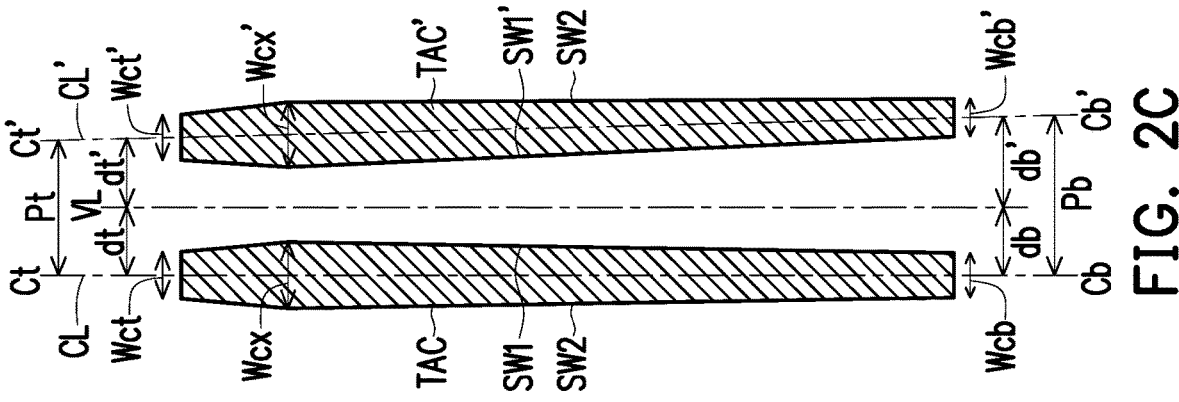
FIG. 2A to FIG. 2G show schematic diagrams of various adjacent contacts.
Figure 2B:
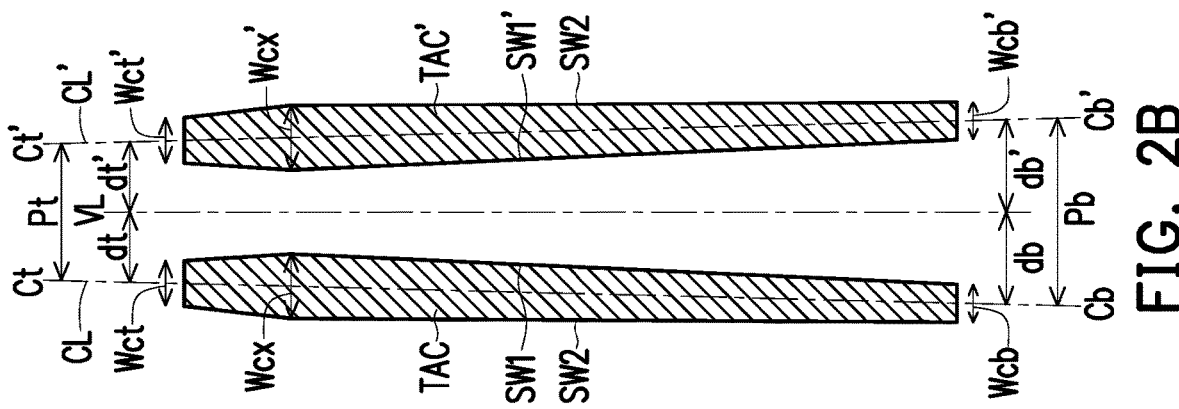
Figure 2A:
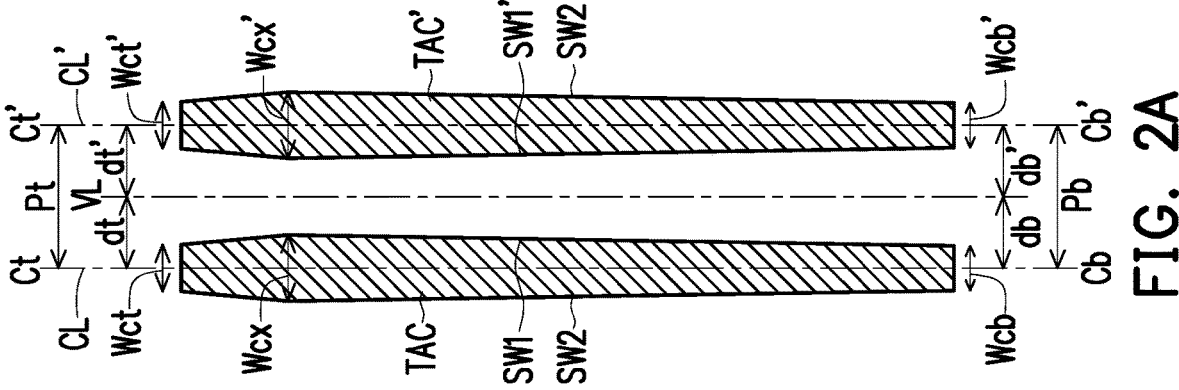

Referring to FIG. 2A, the center point Ct of the top width of the contact TAC and the center Cb of the bottommost width form a centerline CL. The center point Ct' of the top width of the contact TAC' and the center Cb' of the bottommost width form a centerline CL'. The pitch between the center points Ct and Ct' is Pt. The pitch between the center points Cb and Cb' is Pb. The distances between the center points Ct, Ct' and the vertical centerline VL are respectively dt and dt'. The vertical centerline VL refers to the centerline that is perpendicular to the substrate 10 (shown in FIG. 1) and allows the distance dt and the distance dt' to be equal. The distances between the center points Cb, Cb' and the vertical centerline VL are db and db' respectively. In the embodiment, the distance dt is equal to the distance db. The distances dt, dt', db, db' are equal. There is no shift between the contacts TAC and TAC', and the distance there between is equal from top to bottom. This configuration is also referred to as a standard type.

Referring to FIG. 2B, in the embodiment, the top pitch Pt is not equal to the bottom pitch Pb, and the top pitch Pt is smaller than the bottom pitch Pb. The distance dt, dt' is smaller than the distance db, db'. The distance dt is equal to the distance dt'. The distance db and the distance db' may be equal or different. The distance between the contacts TAC and TAC' gradually becomes increased from top to bottom. In the embodiment, compared the standard type of FIG. 2A, the contacts TAC and TAC' are of a double outward shift type. That is, the contacts TAC and TAC' are both inclined outward. A cross-sectional view of a portion of the space between the contacts TAC and TAC' is conical-like shaped. The inclined degree of the contacts TAC and TAC' may be substantially equal or different.

Referring to FIG. 2C, in the embodiment, the top pitch Pt is not equal to the bottom pitch Pb, and the top pitch Pt is smaller than the bottom pitch Pb. The distance dt is equal to the distance dt'. The distance db is not equal to the distance db'. The distance dt is equal to the distance db. The distance dt' is smaller than the distance db', and the distance between the contacts TAC and TAC' gradually becomes increased from top to bottom. In the embodiment, compared the standard type of FIG. 2A, the contact TAC is not inclined, and the contact TAC' is gradually shifted outward from top to bottom. In other words, the contacts TAC and TAC' are of a single outward shift type.

Figure 2D:
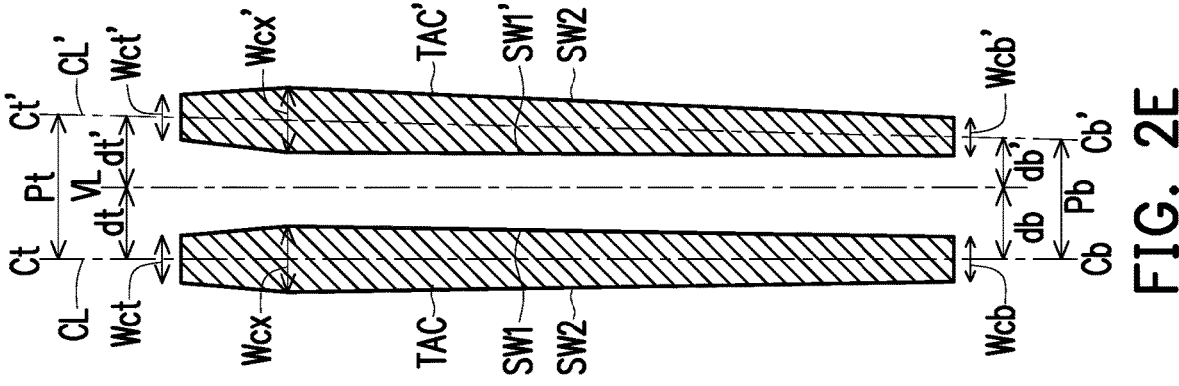

Referring to FIG. 2D, in the embodiment, the top pitch Pt is not equal to the bottom pitch Pb, and the top pitch Pt is larger than the bottom pitch Pb. A difference between the top pitch Pt and the bottom pitch Pb ranges from 1 nm to 50 nm, for example. The distance dt, dt' is larger than the distance db, db'. The distance dt is equal to the distance dt'. The distance db and the distance db' may be equal or different. The distance between the contacts TAC and TAC' gradually becomes decreased from top to bottom. In the embodiment, compared the standard type of FIG. 2A, the contacts TAC and TAC' are both inclined or shifted inward. The inclined degree of the contacts TAC and TAC' may be substantially equal or different.

Figure 2E:
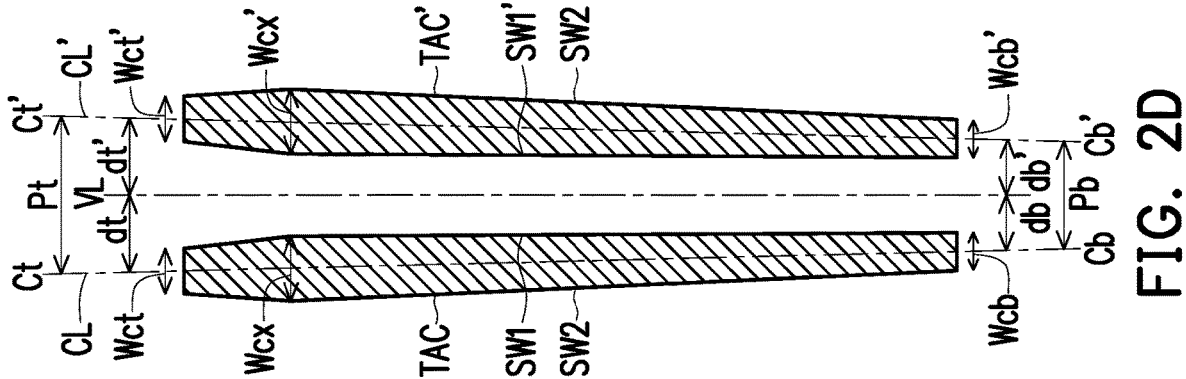

Referring to FIG. 2E, in the embodiment, the top pitch Pt is not equal to the bottom pitch Pb, and the top pitch Pt is larger than the bottom pitch Pb. A difference between the top pitch Pt and the bottom pitch Pb ranges from 1 nm to 50 nm, for example. The distance dt is equal to the distance dt'. The distance db is not equal to the distance db'. The distance dt is equal to the distance db. The distance dt' is different from the distance db', and the distance between the contacts TAC and TAC' gradually becomes decreased from top to bottom. In the embodiment, compared the standard type of FIG. 2A, the contact TAC is not inclined, and the contact TAC' is gradually inclined or shifted inward from top to bottom. In other words, the contacts TAC and TAC' are of a single inward shift type.

Figure 2G:
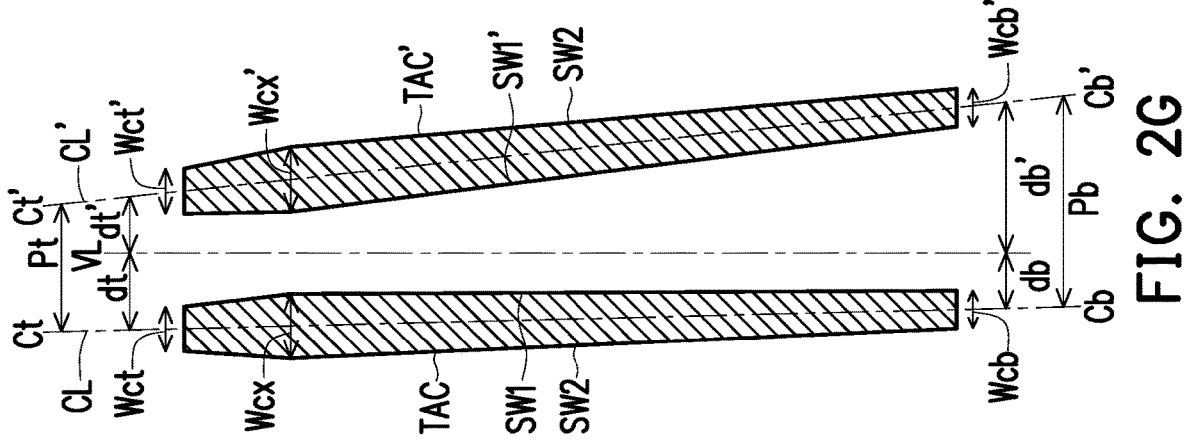
Figure 2F:
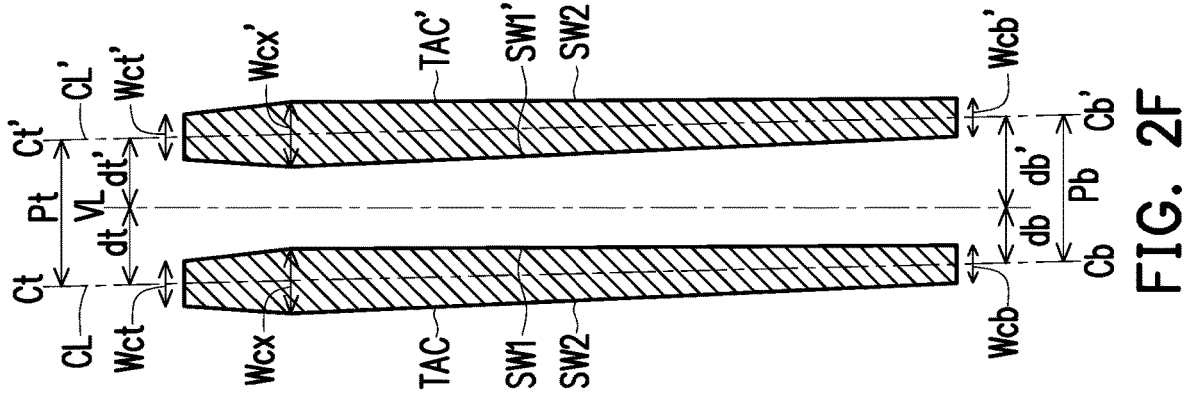

Referring to FIG. 2F, in the embodiment, the top pitch Pt is equal to the bottom pitch Pb. The distance dt is equal to the distance dt'. The distance db is not equal to the distance dt, and the distance db is smaller than the distance dt. The distance db' is not equal to the distance dt', and the distance db' is larger than the distance dt'. The distance db is not equal to the distance db', and the distance db' is larger than the distance db. The contacts TAC and TAC' are both inclined. The inclined degree of the contacts TAC and TAC' may be substantially same. In the embodiment, compared the standard type of FIG. 2A, the contact TAC is of an inward shift type, and the contact TAC' is of an outward shift type.

Referring to FIG. 2G, in the embodiment, the top pitch Pt is not equal to the bottom pitch Pb, and the bottom pitch Pb is larger than the bottom pitch Pb. The distance dt is equal to the distance dt'. The distance db is not equal to the distance dt, and the distance db is smaller than the distance dt. The distance db' is not equal to the distance dt', and the distance db' is larger than the distance dt'. The distance db is not equal to the distance db', and the distance db' is larger than the distance db. In the embodiment, compared the standard type of FIG. 2A, the contact TAC is of an inward shift type, and the contact TAC' is of an outward shift type. The contacts TAC and TAC' are both inclined. The inclined degree of the contacts TAC and TAC' may be very different. The inclined degree of the contact TAC' of FIG. 2G is larger than the inclined degree of the contact TAC' of FIG. 2F.

For the various contacts TACs and TAC's shown in FIG. 2A to FIG. 2G above, the etching anisotropy for forming the contact openings OP3 and OP3' may be adjusted by controlling the power of the plasma-enhanced etching process. For example, the etching anisotropy may be improved by using a plasma-enhanced etching process with a higher power. On contrary, the etching anisotropy may be reduced by using a plasma-enhanced etching process with a lower power. When the smaller power is used, the deviation between the top pitch Pt and bottom pitch Pb is larger than 80 nm, even larger than 100 nm. If the higher power is used the deviation between the top pitch Pt and bottom pitch Pb is smaller than 50 nm, even smaller than 20 nm. The minimal distances D2 of TAC and TAC' to its neighboring sidewall sw3 or sw4 of the stop structure 95 can sustain certain level by larger than 80 nm as shown in FIG. 1.

For the various contacts TACs and TAC's shown in FIG. 2A to FIG. 2G above, the different etching chemicals can be applied to shrink bottom width Wcb and Wcb'. The heavier polymers used in the etching process would lead to the minimum deviation between the bow maximum width Wcx (Wcx') and bottom width Wcb (Wcb') of the contact TAC (or TAC') is enlarged to more than 120 nm, or even more than 140 nm from less than 20 nm, and the contact TAC (or TAC') has a conical-like cross-section. In addition, in some embodiments, in order to reduce the contact sheet resistance, the bottom width Wcb (Wcb') of the contact TAC (or TAC') is maintained as larger than 50 nm, or even larger than 10 nm. The minimal distances D2 of TAC and TAC' to its neighboring sidewall sw3 or sw4 of the stop structure 95 can sustain certain level by larger than 80 nm as shown in FIG. 1.

Referring to FIG. 1, the contact TAC and TAC' of the embodiment of the disclosure passes through the dielectric layer 103 and the opening 99. In the embodiment in which the stop structure 95 is a conductive material, in order to prevent the contacts TAC and TAC' from contacting the stop structure 95, an opening 99 is first formed in the stop structure 95 and then the contact TAC and TAC' may pass through the opening 99.

In view of the process, if the contacts TAC and TAC' are not shifted (as shown in FIG. 2A, also referred to as a standard type), the contacts TAC and TAC' are both shifted inward (as shown in FIG. 2D, also referred to as a double inward shift type) or one of the contacts TAC and TAC' is shifted inward (as shown in FIG. 2E, also referred to as a single inward shift type), the contact TAC and TAC' is less likely to be in contact with the stop structure 95 within the process window. Thus, a short is also less likely to occur. However, if the contacts TAC and TAC' are both shifted outward (as shown in FIG. 2B, also referred to as a double outward shift type) or one of the contacts TAC and TAC' is shifted outward (as shown in FIG. 2C, FIG. 2F, or FIG. 2G, also referred to as a single outward shift type), the contact TAC and TAC' is likely to be in contact with the stop structure 95 and cause a short.

In order to reduce or avoid the short between the contact TAC and TAC' and the stop structure 95, the top width Wt of the opening 99 may be increased. However, the extent to which the top width Wt of the opening 99 may be increased is very limited. This is because the support pillars DP are disposed on the stop structure 95 at both sides of the opening 99, and the top width Wt of the opening 99 is limited by the distance D1 between the support pillars DP. In view of the process, there should be a desired number of support pillars DP to prevent the staircase structure SC from collapsing during the etching process for the gate replacement process, and thus the distance D1 between the support pillars DP may not be increased arbitrarily. Therefore, the top width Wt of the opening 99 is limited by the distance D1 between the support pillars DP, and may not be greatly increased.

FIG. 3A to FIG. 3E show schematic cross-sectional views of various profiles of openings 99A-99E of stop layers according to embodiments of the disclosure. The openings 99A-99E of the stop structure 95 may reduce or avoid the occurrence of the short between the stop structure 95 and the contact TAC and TAC' (as shown in FIG. 1). The opening 99A-99E may include a rectangular part 97, a conical part 96 or a combination thereof. The opening 99A-99E may be funnel-shaped, reverse funnel-shaped, or bowl-shaped. The support pillar DP passes through the dielectric layer 103 and lands on the stop structure 95, and even extends into a part of the stop structure 95. The top width Wt of the opening 99A-99E is smaller than the distance D1 between the support pillars DP. Some of the openings 99A-99E have a base angle α ranging from 84° to 86°, and in an embodiment, the base angle α may be 90°. In some embodiments, others of the openings 99A-99E may have a base angle α which is larger than 90°. The ratio of the distance D1 between the support pillars DP and the top width Wt of the opening 99A-99E ranges from 1.03 to 1.15, and the ratio of the top width Wt of the opening 99A-99E to the bottom width Wb of the opening 99A-99E ranges from 1.1 to 0.9.

Figure 3B:
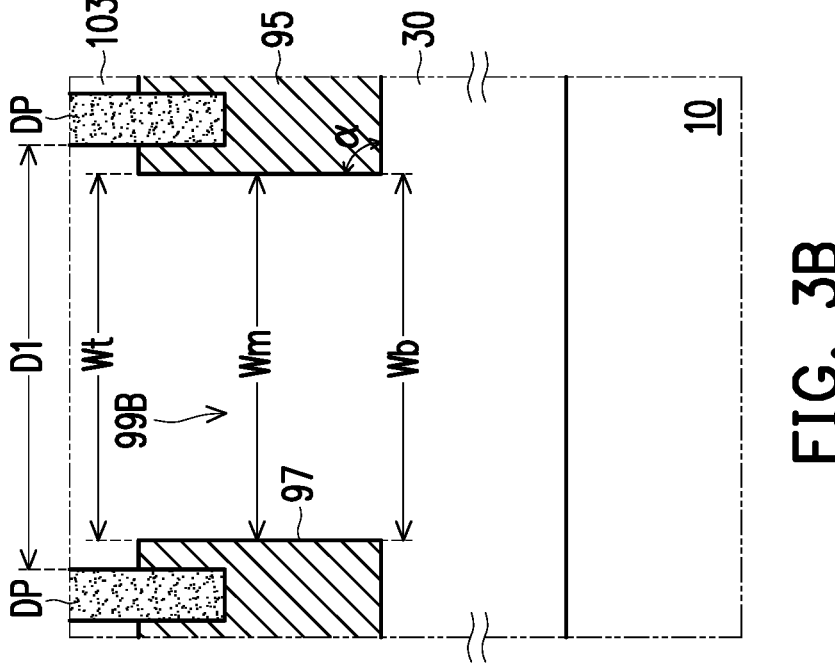
FIG. 3A to FIG. 3E show schematic cross-sectional views of various profiles of openings of stop layers according to embodiments of the disclosure.
Figure 3A:
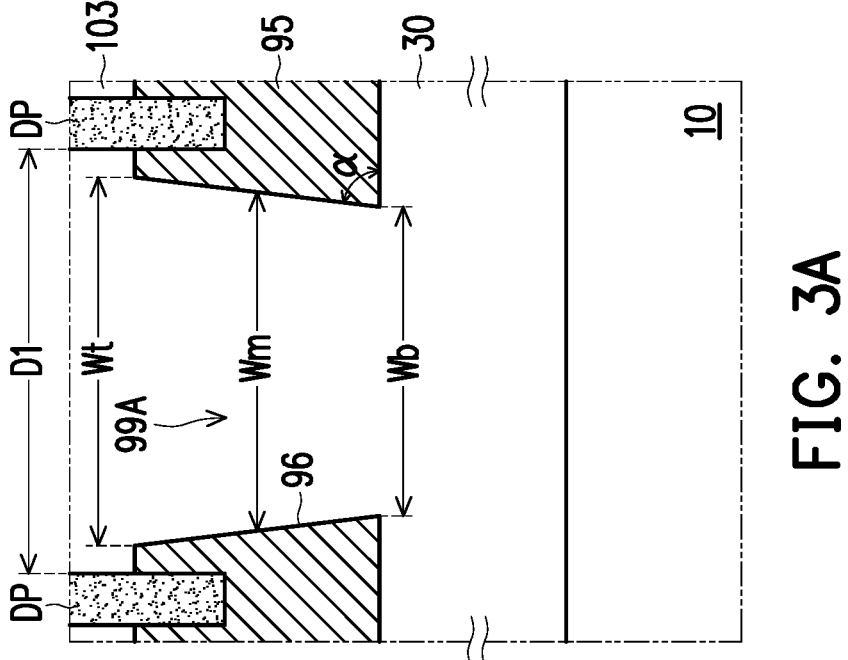

Referring to FIG. 3A, the middle width Wm and the top width Wt of the opening 99A are not equal, and the middle width Wm and the bottom width Wb of the opening 99A are not equal. The opening 99A includes a conical part 96, and a width of the conical part 96 gradually becomes decreased from top to bottom (towards the substrate 10). The base angle α of the opening 99A ranges from 84° to 86°.

Referring to FIG. 3B, the middle width Wm and the top width Wt of the opening 99B are equal, and the middle width Wm and the bottom width Wb of the opening 99B are equal. The opening 99B includes a rectangular part 97. The base angle α of the opening 99B is 90°.

Figure 3D:
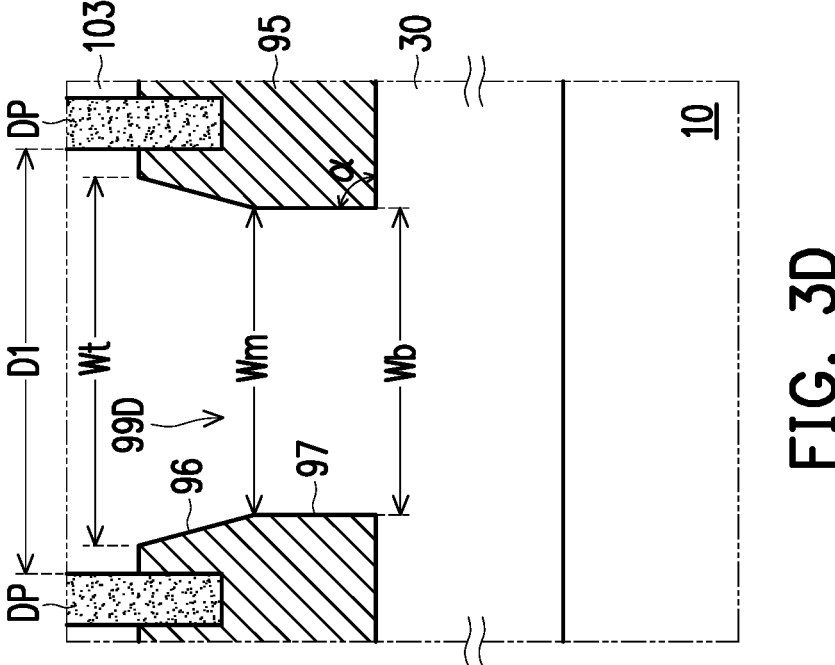
Figure 3C:
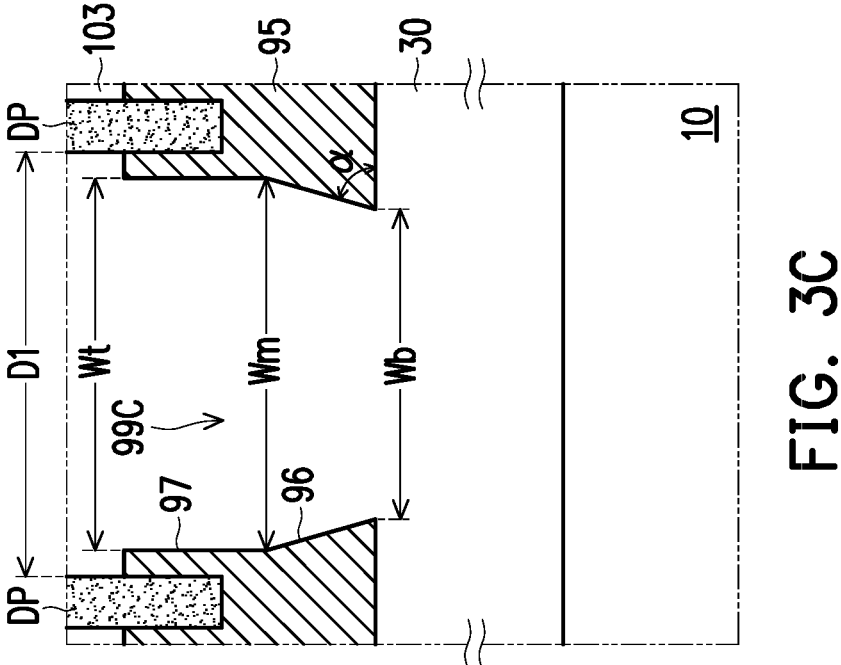

Referring to FIG. 3C, the middle width Wm and the top width Wt of the opening 99C are equal. The middle width Wm and the bottom width Wb of the opening 99B are not equal, and the middle width Wm is larger than the bottom width Wb. The opening 99B includes a rectangular part 97 and a conical part 96. The conical part 96 is closer to the substrate 10 than the rectangular part 97, and a width of the conical part 96 gradually becomes decreased toward the substrate 10. The base angle α of the opening 99C ranges from 84° to 86°.

Referring to FIG. 3D, the middle width Wm of the opening 99D and the bottom width Wb are equal. The top width Wt and the middle width Wm are not equal, and the top width Wt is larger than the middle width Wm. A rectangular part 97 is closer to the substrate 10 than a conical part 96, and a width of the conical part 96 gradually becomes decreased toward the substrate 10. The base angle α of the opening 99D is 90°.

Figure 3E:
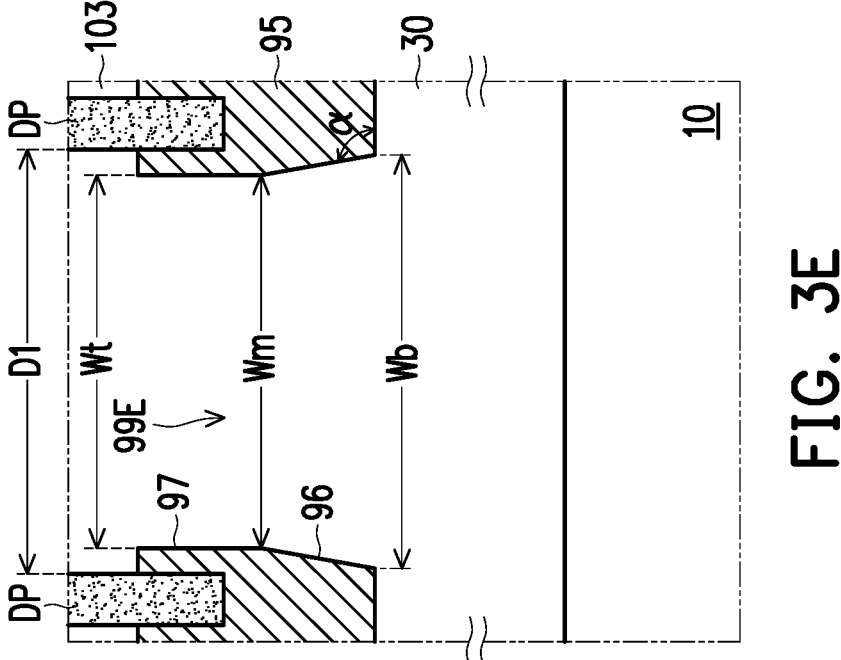

Referring to FIG. 3E, the middle width Wm and the top width Wt of the opening 99E are equal. The middle width Wm and the bottom width Wb are not equal, and the bottom width Wb is larger than the middle width Wm. A conical part 96 is closer to the substrate 10 than a rectangular part 97, and a width of the conical part 96 gradually becomes increased toward the substrate 10. The base angle α of the opening 99E is 90°.

Figure 4A:
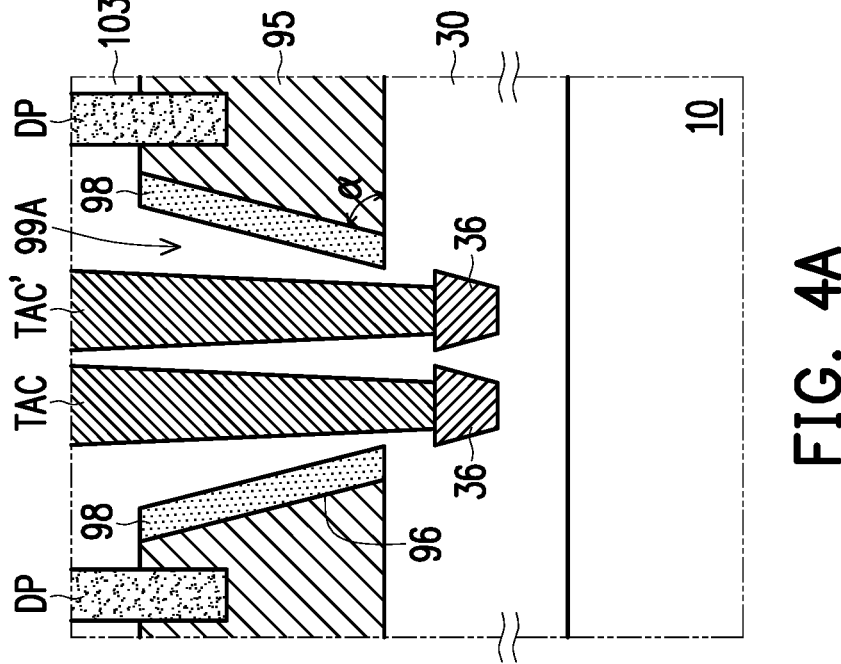
FIG. 4A to FIG. 4C are schematic cross-sectional views of a stop structure and contacts according to some embodiments of the disclosure.
Figure 4C:
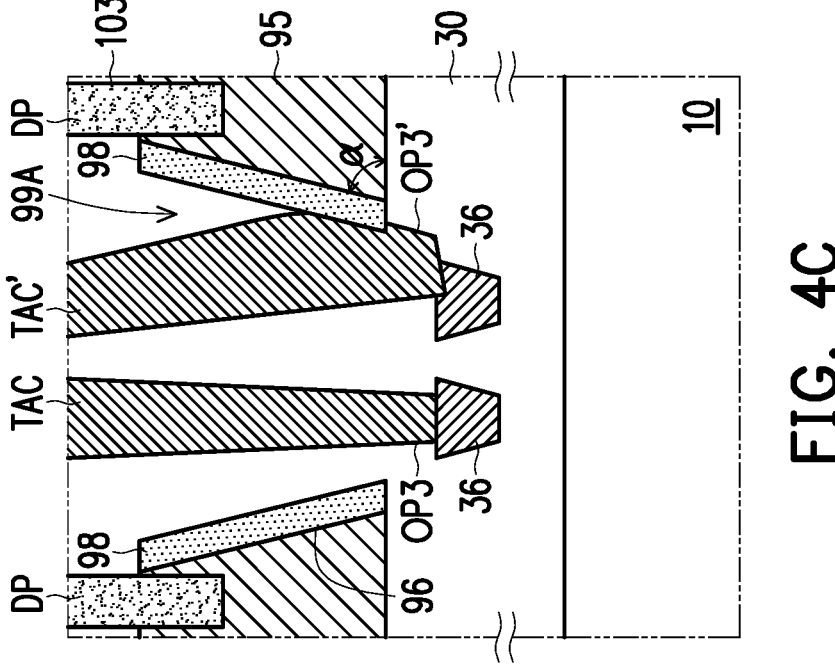
Figure 4B:
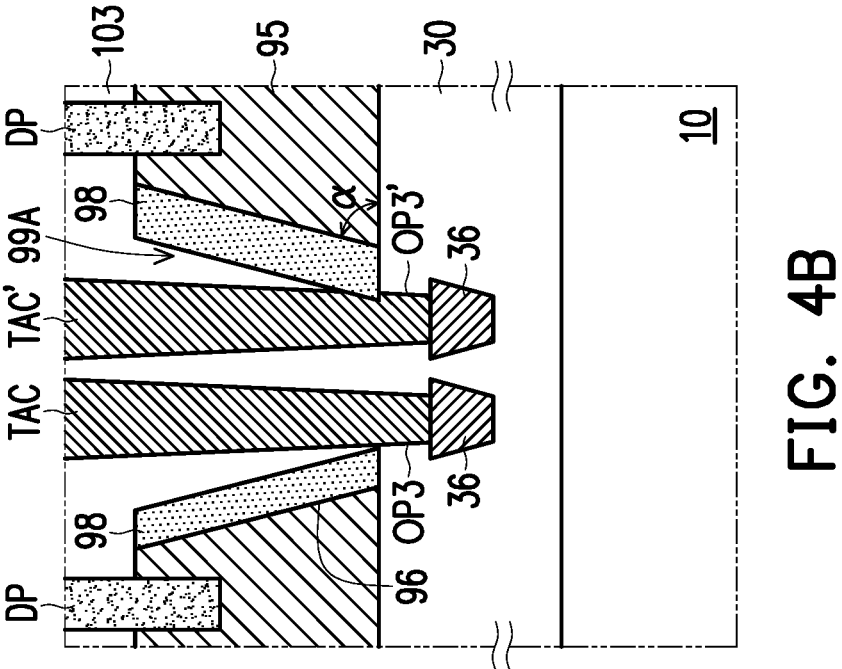

FIG. 4A to FIG. 4C are schematic cross-sectional views of a stop structure and contacts according to some embodiments of the disclosure.

Referring to FIG. 4A to FIG. 4C, the stop structure 95 has an opening 99A, and the sidewall of the opening 99A is covered by a liner layer 98. In some embodiments, the stop structure 95 includes polysilicon, doped polysilicon, or a combination thereof, and the liner layer 98 includes a dielectric material, such as SiON, SiC, SiOC, SiOCN, or a combination thereof.

Referring to FIG. 4A, the contact TAC and TAC' passes through the dielectric layer 103 and the opening 99A, and lands on the conductive line 33. The contacts TAC and TAC' are of the above-mentioned standard type. The contact TAC and TAC' is not in contact with the liner layer 98, and the liner layer 98 is separated from the contact TAC and TAC' by a non-zero distance.

Referring to FIG. 4B, the contact TAC and TAC' passes through the dielectric layer 103 and the opening 99A, and lands on the conductive line 33. The contacts TAC, TAC' are not inclined and are of the above-mentioned standard type. The contacts TAC and TAC' are respectively in contact with the liner layers 98. The portion of the contact TAC being in contact with the liner layer 98 is less than the portion of the contact TAC' being in contact with the liner layer 98. In the process of forming the contact openings OP3 and OP3' of the contacts TAC and TAC', the liner layers 98 may protect the stop structure 95 and prevent the stop structure 95 from being damaged by etching. Moreover, the liner layer 98 may be retained to avoid a short between the contact TAC, TAC' and the stop structure 95.

Referring to FIG. 4C, the contact TAC and TAC' passes through the dielectric layer 103 and the opening 99A, and lands on the conductive line 33. One of the contacts TAC and TAC' is shifted and the contacts TAC and TAC' belong to the above-mentioned single outward shift type. The contact TAC is not inclined, and the contact TAC does not contact the liner layer 98 and is separated from the liner layer 98 by a larger distance. The contact TAC' shifts outward and is severely inclined, and the contact TAC' has a large contact area with the liner layer 98. Similarly, in the process of forming the contact openings OP3 and OP3' of the contacts TAC and TAC', the liner layers 98 may protect the stop structure 95 and prevent the stop structure 95 from being damaged by etching.

The above embodiments illustrate 3D NAND flash memory. However, the disclosure is not limited thereto. The disclosure may also be applied to other 3D flash memories, such as 3D NOR flash memories.

In the embodiment of the disclosure, the opening of the stop structure is designed to have various profiles and angles, or a liner layer is formed on the sidewall of the opening. Thus, even if the contacts are shifted or inclined, the occurrence of a short may be reduced or prevented. Accordingly, the yield of the memory device may be improved.

What is claimed is:
1. A memory device, comprising:
a substrate;
an interconnect structure, located above the substrate;
a staircase structure, located above the interconnect structure;
a dielectric layer, located above the interconnect structure and covering the staircase structure;
a stop structure, located between the interconnect structure and the staircase structure, and between the interconnect structure and the dielectric layer, wherein the stop structure has an opening exposing the interconnect structure;

a first contact, extending through the dielectric layer and the opening, and connected to an interconnect of the interconnect structure, wherein a middle width of the opening is not equal to a top width of the opening, or the middle width of the opening is not equal to a bottom width of the opening, and wherein the opening includes a rectangular part and a conical part, and the rectangular part and the conical part together form a funnel shape, an inverted funnel shape or a bowl shape.

2. The memory device of claim 1, wherein the conical part is closer to the substrate than the rectangular part, and a width of the conical part gradually becomes decreased toward the substrate.

3. The memory device of claim 1, wherein the conical part is closer to the substrate than the rectangular part, and a width of the conical part gradually becomes increased toward the substrate.

4. The memory device of claim 1, wherein the rectangular part is closer to the substrate than the conical part, and a width of the conical part gradually becomes decreased toward the substrate.

5. The memory device of claim 1, further comprising a second contact extending through the dielectric layer and the opening and connected to the interconnect of the interconnect structure.

6. The memory device of claim 5, wherein a bottom pitch of the first contact and the second contact is larger than a top pitch of the first contact and the second contact.

7. The memory device of claim 6, wherein an inclined degree of the first contact is different from an inclined degree of the second contact.

8. The memory device of claim 5, wherein a bottom pitch of the first contact and the second contact is smaller than a top pitch of the first contact and the second contact, and a difference between the bottom pitch and the top pitch ranges from 1 nm to 50 nm.

9. A memory device, comprising:

a substrate;

an interconnect structure, located above the substrate;

a staircase structure, located above the interconnect structure;

a dielectric layer, located above the interconnect structure and covering the staircase structure;

a stop structure, located between the interconnect structure and the staircase structure, and between the interconnect structure and the dielectric layer, wherein the stop structure has an opening exposing the interconnect structure;

a first contact and a second contact, extending through the dielectric layer and the opening, and connected to an interconnect of the interconnect structure; and a plurality of liner layers, located on a sidewall of the opening.

10. The memory device of claim 9, wherein the plurality of liner layers are separated from the first contact and the second contact by a non-zero distance.

11. The memory device of claim 9, wherein the first contact is separated by a non-zero distance from a first adjacent one of the plurality of liner layers, and the second contact is in contact with a second adjacent one of the plurality of liner layers.

12. The memory device of claim 9, wherein a bottom pitch of the first contact and the second contact is larger than a top pitch of the first contact and the second contact.

13. The memory device of claim 12, wherein an inclined degree of the first contact is different from an inclined degree of the second contact.

14. The memory device of claim 9, wherein the stop structure includes a conductive material, and the plurality of liner layers include a dielectric material.

15. The memory device of claim 9, wherein the stop structure includes polysilicon, and the plurality of liner layers include SiON, SiC, SiOC, SiOCN or a combination thereof.

16. The memory device of claim 9, further comprising a plurality of support pillars, wherein the plurality of support pillars extend through the dielectric layer, land on the stop structure and are adjacent to the plurality of liner layers.

17. A memory device, comprising:

a substrate;

an interconnect structure, located above the substrate;

a staircase structure, located above the interconnect structure;

a dielectric layer, located above the interconnect structure and covering the staircase structure;

a stop structure, located between the interconnect structure and the staircase structure, and between the interconnect structure and the dielectric layer, wherein the stop structure has an opening exposing the interconnect structure; and a first contact and a second contact, extending through the dielectric layer and the opening, and connected to an interconnect of the interconnect structure, wherein a base angle of the opening ranges from 84° to 86° or is larger than 90°, and wherein the opening includes a rectangular part and a conical part, and the rectangular part and the conical part together form a funnel shape, an inverted funnel shape or a bowl shape.

18. The memory device of claim 17, further comprising a plurality of support pillars, wherein the plurality of support pillars extend through the dielectric layer and land on the stop structure around the opening.

19. The memory device of claim 18, wherein a ratio of a distance between the plurality of support pillars to a top width of the opening ranges from 1.03 to 1.15, and a ratio of the top width of the opening to a bottom width of the opening ranges from 1.1 to 0.9.

* * * * *